United States Patent
Nogami et al.

(10) Patent No.: US 6,294,396 B1
(45) Date of Patent: Sep. 25, 2001

(54) MONITORING BARRIER METAL DEPOSITION FOR METAL INTERCONNECT

(75) Inventors: Takeshi Nogami, Kanagawa (JP); Susan Chen, Santa Clara; Imran Hashim, San Jose, both of CA (US)

(73) Assignees: Advanced Micro Devices, Inc., Sunnyvale; Applied Materials Inc., Santa Clara, both of CA (US)

( * ) Notice: Subject to any disclaimer, the term of this patent is extended or adjusted under 35 U.S.C. 154(b) by 0 days.

(21) Appl. No.: 09/461,512

(22) Filed: Dec. 14, 1999

Related U.S. Application Data

(63) Continuation of application No. 09/132,116, filed on Aug. 11, 1998, now abandoned.

(51) Int. Cl.[7] .......................... H01L 21/66; G01R 31/26
(52) U.S. Cl. ................... 438/16; 438/14; 438/686; 438/687; 438/720; 438/723; 438/724; 438/754; 438/756; 374/57; 374/178
(58) Field of Search .................... 438/14, 16, 686, 438/687, 720, 723, 724, 754, 756; 374/57, 178

(56) References Cited

U.S. PATENT DOCUMENTS 6,107,201 * 8/2000 Lee ........................................ 438/688

OTHER PUBLICATIONS

Wolf, Silicon Processing for the VLSI Era, vol. 2–Process Integration, 1990, Lattice Press, pp. 113 and 193.*

* cited by examiner

Primary Examiner—John F. Niebling
Assistant Examiner—David A. Zarneke
(74) Attorney, Agent, or Firm—Mikio Ishimaru

(57) ABSTRACT

The barrier effectiveness of a barrier material with respect to a conductive material is evaluated by providing a silicon substrate and then etching said silicon substrate to define an opening therein. The barrier material is then deposited in the opening, followed by a deposition of the conductive material. The silicon substrate is then heated at a predetermined temperature, and reactions between the conductive material and the silicon substrate are detected using a SEM or an optical microscope.

30 Claims, 3 Drawing Sheets

MONITORING BARRIER METAL DEPOSITION FOR METAL INTERCONNECT

CROSS-REFERENCE TO RELATED APPLICATION(S)

This is a continuation of application Ser. No. 09/132,116 filed on Aug. 11, 1998, now abandoned.

TECHNICAL FIELD

The present invention relates generally to semiconductors and more specifically to barrier materials used in semiconductor processing.

BACKGROUND ART

In the process of manufacturing integrated circuits, after the individual devices, such as the transistors, have been fabricated in the silicon substrate, they must be connected together to perform the desired circuit functions. This connection process is generally called "metalization", and is performed using a number of different photolithographic and deposition techniques.

In one connection process, which is called a "dual damascene" technique, two channels of conductive materials, are positioned in vertically separated planes perpendicular to each other and interconnected by a vertical "via" at their closest point.

The first channel part of the dual damascene process starts with the placement of a first channel oxide layer over the semiconductor devices. A first damascene step photoresist is then placed over the oxide layer and is photolithographically processed to form the pattern of the first channels. An anisotropic oxide etch is then used to etch out the channel oxide layer to form the first channel openings. The damascene step photoresist is stripped and a barrier material is deposited to coat the walls of the first channel openings to prevent diffusion of subsequently deposited conductive material into the oxide layer and the semiconductor. A first conductive material is then deposited and subjected to a chemical-mechanical polishing process which removes the first conductive material above the first channel oxide layer and damascenes the first conductive material in the first channel openings to form the first channels.

The via formation step of the dual damascene process starts with the deposition of a thin stop nitride over the first channels and the first channel oxide layer. Subsequently, a separating oxide layer is deposited on the stop nitride. This is followed by deposition of a thin via nitride. Then a via step photoresist is used in a photolithographic process to designate round via areas over the first channels.

A nitride etch is then used to etch out the round via areas in the via nitride. The via step photoresist is then removed, or stripped. A second channel oxide layer is then deposited over the via nitride and the exposed oxide in the via area of the via nitride. A second damascene step photoresist is placed over the second channel oxide layer and is photolithographically processed to form the pattern of the second channels. An anisotropic oxide etch is then used to etch the second channel oxide layer to form the second channel openings and, during the same etching process to etch the via areas down to the thin stop nitride layer above the first channels to form the via openings. The damascene photoresist is then removed, and a nitride etch process removes the nitride above the first channels in the via areas. A barrier material is then deposited to coat the via openings and the second channel openings. This is followed by a deposition of the second conductive material in the second channel openings and the via openings to form the second channel and the via. A second chemical mechanical polishing process leaves the two vertically separated, horizontally perpendicular channels connected by cylindrical vias.

The use of the dual damascene technique eliminates metal etch and dielectric gap fill steps typically used in metalization process. The elimination of metal etch steps is important as the semiconductor industry moves from aluminum to other metalization materials, such as copper, which are very difficult to etch.

One drawback of using copper is that copper diffuses rapidly through various materials. Unlike aluminum, copper also diffuses through dielectrics, such as oxide. When copper diffuses through dielectrics, it can cause damage to neighboring devices on the semiconductor substrate. To prevent diffusion, materials such as tantalum nitride, titanium nitride, and tungsten nitride are used as barrier materials for copper.

The "barrier effectiveness" of a barrier material layer with respect to a conductive material is its ability to prevent diffusion of the conductive material. The barrier effectiveness of a barrier material layer is determined by its thickness, including the thickness uniformity, and its quality, including the number and sizes of defects such as pinholes which form on deposition. To resist copper diffusion, it is found that a minimum barrier material thickness of 5 nm is required. However, to minimize the resistance due to the barrier material layer, it is desirable to maintain a thin barrier material layer. Therefore, it is typical to keep the barrier material layer thickness close to about 5 nm. While it is generally easy to maintain a minimum thickness of 5 nm at the bottom of the channels or vias, it is difficult to do so at the sidewalls of the channels or the vias. Occasionally, there may be insufficient barrier material thickness at the sidewalls which would allow copper to diffuse through, causing damages to adjacent devices. Additionally, defects such as pinholes are often found in a barrier material layer. Copper would diffuse through those defects as well. Furthermore, the stoichimetric composition of an alloyed barrier material, such as tantalum-silicon-nitride (Ta—Si—N), may not be uniform across the feature due to different sputter yields of Ta, Si, and N that may affect the barrier effectiveness as well. Therefore, it is desirable to monitor the barrier effectiveness of a barrier material layer to ensure that thickness is sufficient or that its quality is good enough such that no copper will diffuse through the barrier material layer.

The conventional method to monitor the barrier effectiveness of a barrier material layer for copper is by testing the copper lines and vias for leakage during bias temperature stressing. However, a major drawback of either of these methods is that they are very time-consuming due to the extensive sample preparation procedures required. It is typical to take one to two weeks to obtain the monitor results using either of the above methods. Thus these methods are not practical in a manufacturing environment where fast turn around time of the monitor result is needed to provide feedback so that appropriate corrective actions may be taken prior to the processing of additional wafers.

A solution, which would speed up the evaluation of the barrier effectiveness of barrier material layers with respect to a conductive material, has long been sought, but has eluded those skilled in the art. As the semiconductor industry is moving from aluminum to copper and other type of materials with greater electrical conductivity and diffusiveness through dielectrics, it is becoming more pressing that a solution be found so that practical monitoring of barrier effectiveness can be performed in a production environment.

DISCLOSURE OF THE INVENTION

The present invention provides a method for evaluating the barrier effectiveness of a barrier material with respect to a conductive material by providing a silicon substrate and then etching said silicon substrate to define an opening therein. Next, the barrier material is deposited in the opening. The barrier material deposition is followed by the deposition of the conductive material. The silicon substrate is then heated at a predetermined temperature and reactions between the conductive material and the silicon substrate are detected using a scanning electron microscope (SEM) or an optical microscope.

The present invention provides a method for monitoring the barrier effectiveness of a barrier material disposed in a silicon substrate with respect to a conductive material by identifying the presence of at least one silicon-containing compound formed as a result of the diffusion of the conductive material through the barrier material into the silicon substrate.

The present invention further provides a method for monitoring the barrier effectiveness of a barrier material in a production environment by providing quick turn around of the monitor result so that appropriate actions may be taken in a timely fashion.

The above and additional advantages of the present invention will become apparent to those skilled in the art from a reading of the following detailed description when taken in conjunction with the accompanying drawings.

BEST MODE FOR CARRYING OUT THE INVENTION

Figure 1A:
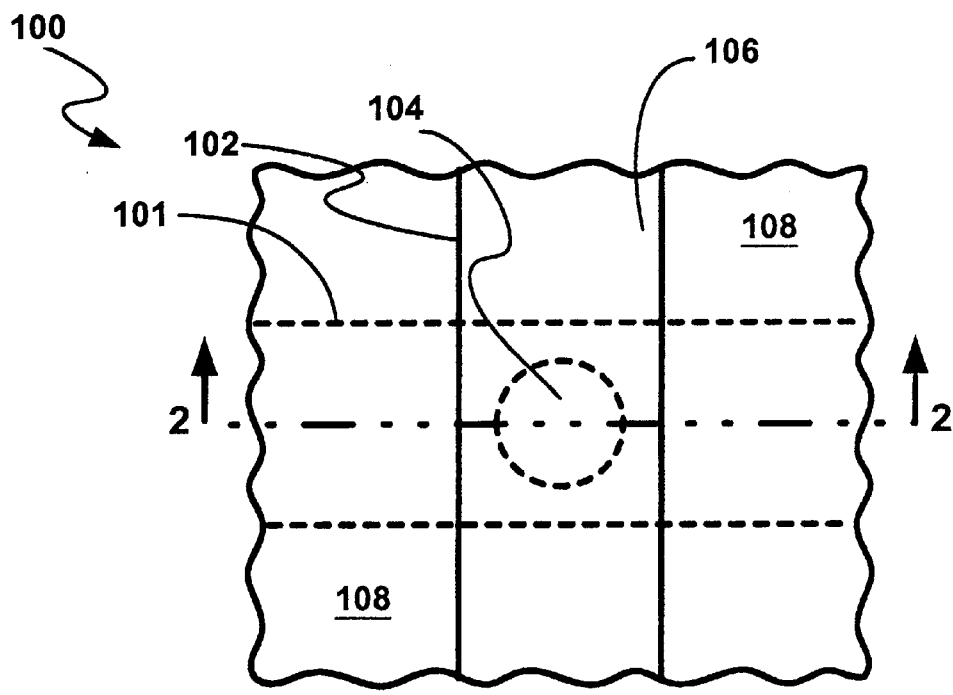
FIG. 1A (PRIOR ART) is a plan view of aligned channels with a prior art via.

Referring now to FIG. 1A (PRIOR ART), therein is shown a plan view of a prior art pair of aligned semiconductor channels of a conductive material such as aluminum, copper, tungsten or polysilicon disposed over a production semiconductor wafer 100. A first channel 101 is shown disposed below a second channel 102 which extends substantially perpendicular to the first channel 101 in the plan view. Similarly, a round via 104 connects the first and second channels 101 and 102 and is a part of the second channel 102. The first channel comprises a first conductive material. The second channel 102 is formed by filling a second channel opening 106 disposed in a second channel oxide layer 108 with a second conductive material.

Figure 1B:
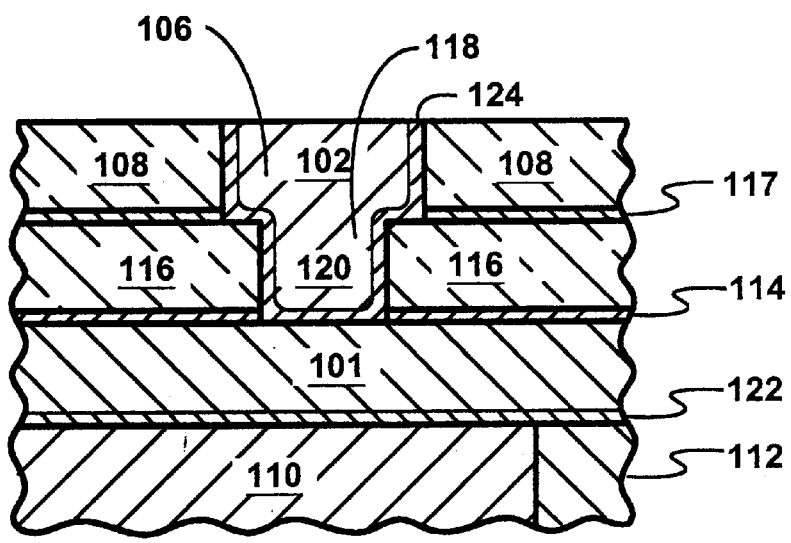
FIG. 1B (PRIOR ART) is a cross-section of FIG. 1A (PRIOR ART) along line 2—2.

Referring now to FIG. 1B (PRIOR ART), therein is shown a cross-section of FIG. 1A (PRIOR ART) along 2—2. The first channel 101 is disposed over a polysilicon gate 110 and a dielectric 112 of a semiconductor device on an integrated circuit chip (not shown). The first and second channels 101 and 102 are in horizontal planes separated vertically by a stop nitride layer 114, a via oxide layer 116, and a thin via nitride layer 117. The cross-sectional area of the round via 104 of FIG. 1A (PRIOR ART) defines a cylindrical via 120 when it is filled with the second conductive material.

Also shown disposed around the first channel 101 is barrier material 122, and around the second channel 102 and the cylindrical via 120 is barrier material 124. Barrier materials, where necessary, are used to prevent diffusion of the conductive materials into the adjacent areas of the semiconductor. Titanium nitride, titanium silicon nitride, tantalum nitride, tantalum silicon nitride, tungsten nitride, or tungsten silicon nitride are examples of barrier materials for copper channels while a compound of trace percentages of copper would be used for aluminum channels. For purposes of clarity, the barrier materials 122 and 124 are not shown in FIG. 1A (PRIOR ART).

FIGS. 2A through 2D depict a method according to the present invention to evaluate the barrier effectiveness of a barrier material with respect to a conductive material.

Figure 2A:
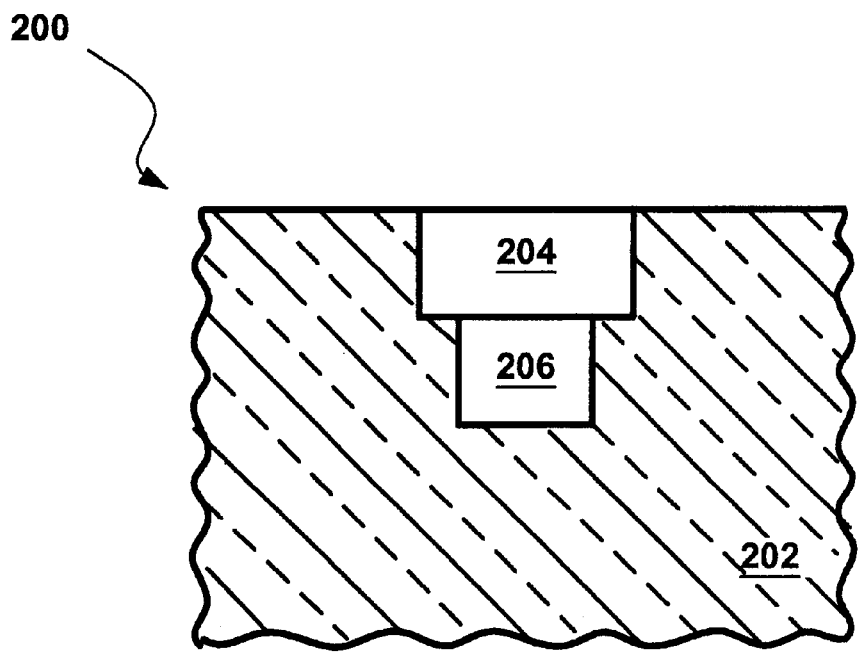
FIGS. 2A through 2D depict a method according to the present invention for evaluating the barrier effectiveness of a barrier material with respect to a conductive material.

Referring to FIG. 2A, therein is shown the cross-section of a semiconductor monitor wafer 200. At this stage is shown a silicon substrate 202 with a channel opening 204 and a via opening 206 formed therein. The dimensions of the channel opening 204 and via opening 206 are identical to those channel openings and via openings of devices in a production wafer. As discussed earlier, the channel openings and via openings in a production wafer device are typically formed in dielectric layers, such as an oxide layers. In the monitor wafer 200 of the present invention, the channel opening 204 and the via opening 206 are formed directly in the silicon substrate 202.

Figure 2B:
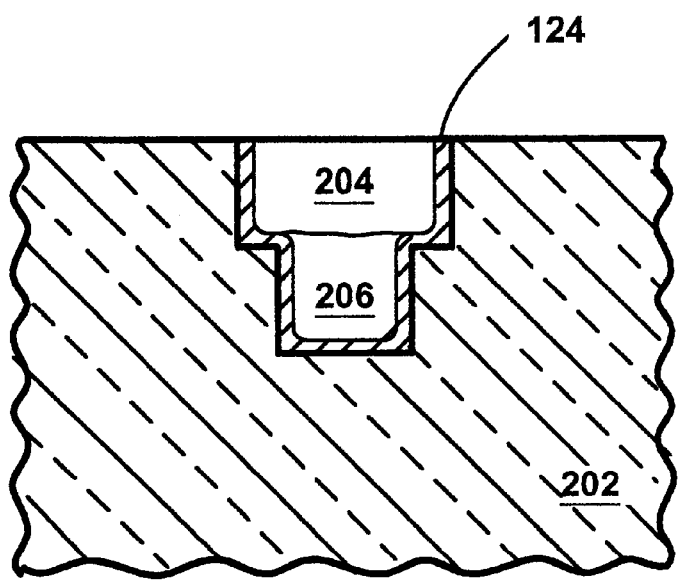

Referring to FIG. 2B, therein is shown the barrier material 124 formed around the walls of the channel opening 204 and via opening 206.

Figure 2C:
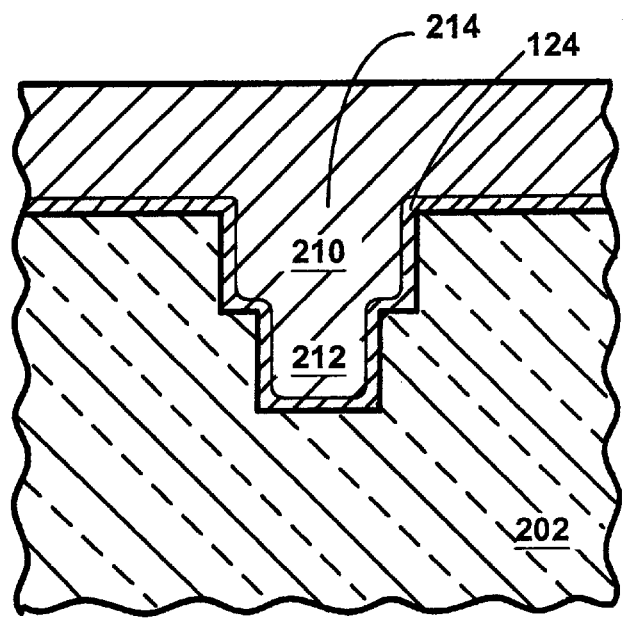

Referring to FIG. 2C, therein is shown a channel 210 and a via 212 formed after the channel opening 204 and via opening 206 is respectively filled with a conductive material 214 such as copper.

Figure 2D:
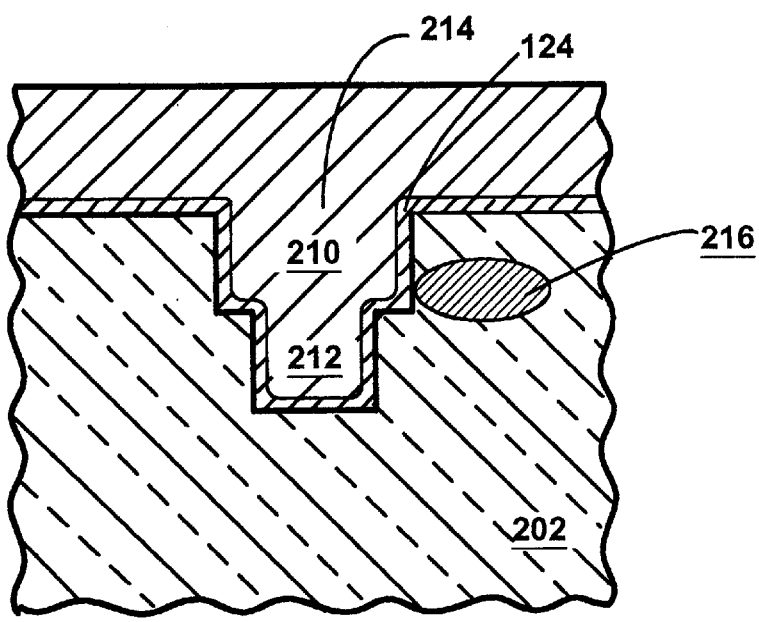

Referring to FIG. 2D, therein is shown the thermal annealing of the silicon substrate 202. The thermal annealing enhances the diffusion of the conductive material 214 through the barrier material 124. Barrier material 124 suffers from diffusion when its barrier effectiveness is too low because it is too thin. This can occur when the barrier material 124 is thinner than 5 nm in areas or is thin enough to allow pinholes which reduces the thickness at points to less than 5 nm. When the conductive material 214 diffuses into the silicon substrate, it reacts with the silicon to form at least one silicon-containing compound 216. If the conductive material 214 is copper, then copper silicide can be formed at relatively low temperatures greater than 200° C. Copper silicide formed in the silicon substrate 202 can be readily detected using SEM or optical microscope as will be explained below.

In production, a conventional first damascene process was used to put down over a production semiconductor wafer 100 a first channel 101 in a first channel oxide layer (not shown) above portions of a semiconductor device 110 and 112. The damascene process is a photolithographic process which uses a mask to define a first channel opening (not shown) in the first channel oxide layer to run in a first direction (which is horizontal in FIG. 1A (PRIOR ART)). The first channel opening is then filled with a first conductive material to form the first channel 101 using conventional metal deposition technique, such as physical vapor deposition, chemical vapor deposition, electroplating, or a combination thereof. The stop nitride layer 114, the via oxide layer 116, and the via nitride layer 117 would be successively deposited on top of the first channel 101 and the first channel oxide layer using conventional deposition technique.

By using the via photoresist and the via photolithographic process followed by nitride etching of a round via opening 118 in the via nitride layer 117, the basis for the cylindrical via 120 was formed. The subsequent deposition of the second channel oxide layer 108 prepared the way for the second channel 102 to be perpendicular to the first channel 101. The second damascene process is a photolithographic process which uses a mask to define the second channel opening 106 in the second channel oxide layer 108. Since the second damascene process uses an anisotropic oxide etch, the etch also forms the cylindrical via opening 118 down to the stop nitride layer 114. The anisotropic oxide etch etches faster in the vertical direction of FIG. 1B (PRIOR ART) than in the horizontal direction. The nitride etch of the stop nitride layer 114 completes the etching steps. The deposition of the barrier material and the second conductive material into second channel opening 106 and via opening 118 forms the second channel 102 and the cylindrical via 120. The barrier material 124 is deposited using conventional deposition techniques, such as physical vapor deposition, chemical vapor deposition, electroless plating, or a combination thereof. Similarly, the second conductive material is deposited using conventional metal deposition technique, such as physical vapor deposition, chemical vapor deposition, electroplating, or a combination thereof. Thereafter, a chemical mechanical polishing process is used to complete the conventional connection process.

Due to the variation in the quality and conformality of the barrier material deposited around the walls of second channel 102 and the via 120, often there are areas with insufficient barrier material thickness or defects such as pinholes. Areas with insufficient thickness and defects reduce the barrier effectiveness of the barrier material layer making it prone to diffusion of the conductive materials. As explained earlier, unlike aluminum, copper can diffuse through dielectrics such as oxide. Therefore, when the barrier effectiveness of a barrier material layer is reduced, copper would diffuse into the neighboring oxide layer through the barrier material layer. Copper would continue to diffuse through the oxide layer and into adjacent devices causing damages to those devices. Thus it is important to have a method which would monitor the barrier effectiveness of barrier material layers in a production environment. However, diffusion of copper to dielectric materials such as oxide can only be detected by using either analytical techniques such as TEM or electrical tests such as bias temperature stress test. Both of these types of tests are time-consuming processes because of extensive sample preparations or processing steps, making these methods unsuitable to be used in a production environment.

The present invention uses a new test structure and test method for the purpose of monitoring barrier effectiveness of a barrier material layer at the walls of channels and vias in semiconductor wafer.

In manufacturing the monitor wafer 200 of the present invention, a conventional damascene process is used to etch the silicon substrate 202 to define the channel opening 204 and the via opening 206 as shown in FIG. 2A. Channel openings 204 and via opening 206 have the same dimensions as channel opening 106 and via opening 118 of the second channel 102 and via 120 in the production wafer 100 as shown in FIG. 1B (PRIOR ART).

To monitor the barrier effectiveness of barrier material layers in a production wafer with channel openings and via openings of various sizes, a monitor wafer with channel openings and via openings having the sizes identical to those of the production wafer will be used. However, unlike the production wafers 100, the channel opening 204 and via opening 206 in the monitor wafer 200 are formed directly on the silicon substrate 202. For purposes of clarity, only one channel opening and one via opening are shown in the monitor wafer 200 of FIG. 2A.

Next, the monitor wafer 200 with channel opening 204 and via opening 206 defined in the silicon substrate 202 will be processed along with production wafers 100 during the deposition of barrier material 124. Barrier material 124 is deposited to coat the walls of channel opening 204 and via opening 206 of the monitor wafer 200, and the channel openings 106 and via openings 118 of the production wafers 100.

The conductive material 214 is then deposited into the channel opening 204 and via opening 206 of the monitor wafer and the channel openings 106 and via openings 118 of the production wafers 100.

Following the deposition of conductive material 214 into the channel opening 204 and via opening 206, the monitor wafer 200 is annealed at a high temperature to enhance the diffusion of the conductive material 214 into the silicon substrate 202 through the barrier material 124. Diffusion to the silicon substrate will occur if the barrier effectiveness of the barrier material 124 is not sufficient because of insufficient thickness or the presence of defects in the barrier material 124. The objective would be to have a high enough temperature to promote the diffusion so that the barrier effectiveness monitor can be accomplished in a reasonable time. At the same time, the temperature would be low enough to prevent the breakdown of the barrier material 124 which would allow the conductive material 214 to diffuse to the silicon substrate 202 regardless of the barrier effectiveness of the barrier material 124 at the time it was deposited.

The monitor wafer may be heated to about and above 250° C; however, preferably the monitor wafer would be heated to about 500° C. and maintained at this temperature for about one hour. If the barrier effectiveness of the barrier material 124 is inadequate, the conductive material 214 would diffuse through the barrier material 124 after the thermal annealing. The diffused conductive material 214 would react with silicon in the silicon substrate 202 to form at least one silicon-containing compound 216. If the conductive material 214 is copper, then the silicon-containing compound 216 would be copper silicide which would be readily detectable by using a SEM or an optical microscope as will be explained below.

Subsequently, the conductive material 214 and barrier material 124 are removed from the silicon substrate 202 using conventional stripping techniques.

Thereafter, the silicon substrate 202 is treated using conventional Secco etching or Wright etching to detect the presence of the silicon-containing compound 216.

Next, the silicon substrate 202 is analyzed by using a SEM or an optical microscope to confirm the presence of the silicon-containing compound 216. Since the use of SEM or optical microscope do not require extensive sample preparation, the entire analysis which includes the stripping of the conductive material 214 and barrier material 124, the Secco etching or Wright etching, and the SEM and microscope confirmation can be completed within a few hours. The fast turnaround time makes it possible to report the result back to the production areas quickly so that corrective actions may be taken in a timely fashion. This will minimize the number of wafers that would be produced with the process that results in inadequate barrier effectiveness. Thus the present invention is suitable for use in monitoring barrier effectiveness of barrier materials in a production environment. In addition, the present invention can be used to buyoff production equipment after setup, maintenance or process recipe adjustments.

While the best mode utilizes copper as the conductive material 214, it should be understood that the present invention is applicable to evaluate the barrier effectiveness of barrier materials used for gold and silver conductors. In fact, the present invention is applicable to evaluate the barrier effectiveness of barrier materials used for other conductive materials if such conductive materials would react with silicon to form at least one silicon-containing compound that is readily detectable by a SEM or an optical microscope.

Although various thermal annealing conditions have been described above, those skilled in the art would understand that other temperatures could be used as long as such temperatures do not cause breakdown of the barrier material layer.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method for evaluating the barrier effectiveness of a barrier material with respect to a conductive material, comprising the steps of:
   providing a silicon substrate;
   etching said silicon substrate to define an opening therein;
   depositing said barrier material in said opening;
   depositing said conductive material in said opening after depositing said barrier material therein;
   heating said silicon substrate at a temperature; and
   detecting reactions between said conductive material and said silicon substrate.

2. The method as claimed in claim 1 wherein the step of depositing said barrier material is done by physical vapor deposition, chemical deposition, or a combination thereof.

3. The method as claimed in claim 1 wherein the step of depositing said conductive material is done by physical vapor deposition, chemical vapor deposition, electroplating, or a combination thereof.

4. The method as claimed in claim 1 wherein the step of heating said silicon substrate is done at a temperature below the temperature at which the said barrier material begins to break down.

5. The method as claimed in claim 1 wherein the step of heating said silicon substrate is continued for about one hour at about 500° C.

6. The method as claimed in claim 1 wherein the step of heating said silicon substrate is continued about and above 250° C.

7. The method as claimed in claim 1 wherein the step of heating said silicon substrate is continued for about one hour at about 250° C. to about 500° C.

8. The method as claimed in claim 1 wherein the step of detecting reactions between said conductive material and said silicon substrate comprises the steps of:
   removing said conductive material and said barrier material from said silicon substrate; and
   analyzing said silicon substrate to identify the presence of at least one silicon-containing compound that is formed as a result of reactions between said conductive material and said silicon substrate.

9. The method as claimed in claim 8 including the step of:
   etching said silicon substrates using Secco etch or Wright etch prior to the step of analyzing said silicon substrate.

10. The method as claimed in claim 8 wherein the step of analyzing said silicon substrate is done by using a scanning electron microscope, an optical microscope, or a combination thereof.

11. The method as claimed in claim 1 wherein said barrier material is a material selected from the group consisting of titanium nitride, titanium silicon nitride, tantalum nitride, tantalum silicon nitride, tungsten nitride, and tungsten silicon nitride.

12. The method as claimed in claim 1 wherein said conductive material is a material selected from the group consisting of copper, gold and silver.

13. A method for evaluating the barrier effectiveness of a barrier material with respect to a conductive material, comprising the steps of:
   providing a silicon substrate;
   etching said silicon substrate to define an opening therein;
   depositing said barrier material in said opening;
   depositing said conductive material in said opening after depositing said barrier material therein;
   heating said silicon substrate at a temperature;
   removing said conductive material and said barrier material from said silicon substrate; and
   analyzing said silicon substrate using a scanning electronic microscope or an optical microscope to identify the presence of at least one silicon-containing compound that is formed as a result of reactions between said conductive material and said silicon substrate.

14. The method as claimed in claim 13 wherein the step of depositing said barrier material is done by physical vapor deposition, chemical deposition, or a combination thereof.

15. The method as claimed in claim 13 wherein the step of depositing said conductive material is done by physical vapor deposition, chemical vapor deposition, electroplating, or a combination thereof.

16. The method as claimed in claim 13 wherein the step of heating said silicon substrate is done at a temperature below the temperature at which the said barrier material begins to break down.

17. The method as claimed in claim 13 wherein the step of heating said silicon substrate is continued for about one hour at about 500° C.

18. The method as claimed in claim 13 wherein the step of heating said silicon substrate is continued at about and above 250° C.

19. The method as claimed in claim 13 wherein the step of heating said silicon substrate is continued for about one hour at about 250° C. to about 500° C.

20. The method as claimed in claim 13 including the step of:
   etching said silicon substrates using Secco etch or Wright etch prior to the step of analyzing said silicon substrate.

21. The method as claimed in claim 13 wherein said barrier material is a material selected from the group consisting of titanium nitride, titanium silicon nitride, tantalum nitride, tantalum silicon nitride, tungsten nitride, and tungsten silicon nitride.

22. The method as claimed in claim 13 wherein said conductive material is a material selected from the group consisting of copper, gold and silver.

23. A method for evaluating the barrier effectiveness of a barrier material with respect to a conductive material, comprising the steps of:

providing a silicon substrate;

etching said silicon substrate to define an opening therein;

depositing said barrier material in said opening;

depositing said conductive material in said opening after depositing said barrier material therein;

heating said silicon substrate for about one hour at about 250° C. to about 500° C.;

removing said conductive material and said barrier material from said silicon substrate;

etching said silicon substrates using Secco etch or Wright etch; and analyzing said silicon substrate using a scanning electronic microscope or an optical microscope to identify the presence of at least one silicon-containing compound that is formed as a result of reactions between said conductive material and said silicon substrate.

24. The method as claimed in claim 23 wherein the step of depositing said barrier material is done by physical vapor deposition, chemical deposition, or a combination thereof.

25. The method as claimed in claim 23 wherein the step of depositing said conductive material is done by physical vapor deposition, chemical vapor deposition, electroplating, or a combination thereof.

26. The method as claimed in claim 23 wherein the step of heating said silicon substrate is done at a temperature below the temperature at which the said barrier material begins to break down.

27. The method as claimed in claim 23 wherein the step of heating said silicon substrate is continued for about one hour at about 500° C.

28. The method as claimed in claim 23 wherein the step of heating said silicon substrate is continued at about and above 250° C.

29. The method as claimed in claim 23 wherein said barrier material is a material selected from the group consisting of titanium nitride, titanium silicon nitride, tantalum nitride, tantalum silicon nitride, tungsten nitride, and tungsten silicon nitride.

30. The method as claimed in claim 23 wherein said conductive material is a material selected from the group consisting of copper, gold and silver.

* * * * *